United States Patent [19]

Sooch

[11] Patent Number: 4,851,841
[45] Date of Patent: Jul. 25, 1989

[54] GAIN SCALING OF OVERSAMPLED ANALOG-TO-DIGITAL CONVERTERS

[75] Inventor: Navdeep S. Sooch, Austin, Tex.

[73] Assignee: Crystal Semiconductor Corporation, Austin, Tex.

[21] Appl. No.: 104,439

[22] Filed: Oct. 2, 1987

[51] Int. Cl.$^4$ ............................................. H03M 3/02
[52] U.S. Cl. ....................................... 341/143; 375/28
[58] Field of Search ................. 340/347 AD, 347 NT; 375/28, 29, 30, 31; 341/139, 143, 158

[56] References Cited

U.S. PATENT DOCUMENTS 4,439,756 3/1984 Shenoi et al. ................. 340/347 NT

OTHER PUBLICATIONS

J. D. Everard; "A Single Channel POM Codec"; International Conference on Communications, Toronto, Canada; June 1978.

*Primary Examiner*—William M. Shoop, Jr.
*Assistant Examiner*—Marc S. Hoff
*Attorney, Agent, or Firm*—Leonard & Lott

[57] ABSTRACT

Method of operation of an A/D converter having an oversampling front end quantizer coupled to a digital decimation filter. The method includes setting an effective feedback reference voltage to a value that is a predetermined factor greater than a specified maximum analog input voltage; and increasing the gain of the digital decimation filter by an amount substantially equal to the predetermined factor. In accordance with another aspect of the invention, an A/D converter includes a delta-sigma modulator wherein the full-scale analog input voltage is set below a maximum effective feedback reference voltage by a predetermined factor; and, the impulse-response coefficients of a digital decimation filter coupled to the output of the delta-sigma modulator are selected to provide full-scale digital output when a full-scale analog input voltage is applied to the analog voltage input.

6 Claims, 4 Drawing Sheets

GAIN SCALING OF OVERSAMPLED ANALOG-TO-DIGITAL CONVERTERS

TECHNICAL FIELD

The present invention generally relates to electronic systems, and, more particularly, to a method of operation of analog-to-digital converters and to circuitry used in conjunction with such method.

BACKGROUND OF THE INVENTION

An A/D converter of the oversampling type is one in which the analog input voltage is sampled at a rate that is substantially higher than the desired output sampling rate of the converter. Converters of this type are well known in the art and typically have an oversampling front end quantizer and a digital decimation filter which processes the output of the front end quantizer. A suitable front-end quantizer for this purpose is the delta-sigma modulator, which is also referred to in the literature as a sigma-delta modulator.

A typical A/D converter of the oversampling type is illustrated in FIG. 1 and is generally indicated by the reference numeral 10. The prior art A/D converter 10 includes a delta-sigma modulator 12 having an output labeled DFAST which is coupled to the input of a digital decimation filter 14. The delta-sigma modulator 12 includes a switched capacitor integrator 16 which receives the analog input at an analog input node 18. The output of the switched capacitor integrator 16 is coupled to one input of a clocked comparator 20, the other input of which is coupled to ground. The output of the clocked comparator 20 provides a signal designated as SELECT. The signal SELECT is used in a feedback loop to determine whether a positive effective feedback voltage reference VREF+ or a negative effective feedback voltage reference VREF− is to be fed back into the switched capacitor integrator 16. In conventional A/D converters of the oversampling type, the positive effective feedback voltage reference is made to have a value that is equal to the specified maximum positive analog input voltage, and the effective negative feedback voltage reference is made to have a value that is equal to the specified maximum negative analog input voltage. See, for example, Hauser, M. W., Hurst, P. J., Brodersen, R. W., "MOS ADC-Filter Combination That Does Not Require Precision Analog Components," ISSCC Digest of Technical Papers, pp. 80–81, 313; Feb., 1985. Also see, for example, FIG. 3 and the discussion thereof in Everard, J. D., "A Single-Channel PCM Codec," IEEE Journal of Solid-State Circuits, Vol. SC-14, No. 1, pp. 25–37; Feb., 1979.

The output of the clocked comparator 20 is coupled through a buffer 22 to provide the signal DFAST to the digital decimation filter 14. The theory and operation of delta-sigma modulators is well known to those of ordinary skill in the art, and, therefore, will not be discussed here in detail. For the present purposes, it should suffice to note that the output DFAST is a continuous high-speed digital bit pattern 11. The digital bit pattern is clocked at the same frequency as that at which the analog input node 18 is sampled. A typical clock rate is 2.048 MHz; this rate is substantially higher than the frequencies of interest applied to the analog input node 18. For a typical application, the frequencies of interest at the analog input node 18 are from DC to approximately 8 kHz. For a given number of samples of the analog input node 18—384 samples, for example—the relative number of logic 1's to logic 0's which are output from the delta-sigma modulator 12 and which comprise the signal DFAST is indicative of the polarity and magnitude of the voltage being applied to the analog input node 18.

It is a function of the digital decimation filter 14 to extract the low frequency analog voltage input information which is embedded in the high-speed serial bit stream being outputted from the delta-sigma modulator 12, and to provide a 16-bit digital representation of that sampled analog input. Another function of the digital decimation filter 14 is to provide a low-pass frequency response for the incoming analog signal. The 16-bit digital output samples are outputted at a much lower rate than that at which the analog input node 18 is sampled by the delta-sigma modulator 12. In the prior art A/D converter 10, it is conventional to internally utilize a large number of predetermined multi-bit digital codes, called impulse-response coefficients, in the convolution process performed by the digital decimation filter 14. See, for example, the above-referenced Hauser article at page 80 and the above-referenced Everard article at page 28. These impulse-response coefficients and the use thereof are further discussed hereinbelow in the Description of a Preferred Embodiment.

Referring now to FIG. 2, for the prior art A/D converter 10, there is illustrated a diagram of noise in the 16-bit digital output as a function of the DC level applied to the analog input node 18. The diagram of FIG. 2 may be constructed in the following manner. A DC voltage is applied to the analog input node 18 while a large number (1000, for example) of the 16-bit digital output codes are recorded. The variation of these digital output codes around an average value is defined as noise. The plot in FIG. 2 of this noise as a function of the DC level of the analog input voltage shows that the noise greatly increases when the analog input voltage approaches either the positive effective voltage reference or the negative effective voltage reference. The plot of FIG. 2 is representative of a second order modulator; for this case, the noise is not appreciable until the magnitude of the DC level of the analog input voltage becomes greater than 8/10 of the effective reference voltage.

In accordance with the foregoing, a need exists for a method for reducing the output noise of an A/D converter of the oversampling type, and particularly with respect to analog input signals having DC levels that approach the specified maximum input voltage limits. Additionally, a need exists for circuitry which may economically be used in conjunction with such method.

SUMMARY OF THE INVENTION

The present invention provides a method for improving the noise characteristics of an A/D converter of the oversampling type, and provides circuitry particularly suitable for such method.

In accordance with one aspect of the invention, a method of operation of an A/D converter having an oversampling front-end quantizer includes setting the effective feedback reference voltage to a value that is a predetermined factor greater than the specified maximum analog input voltage and increasing the magnitude of the impulse-response coefficients of a digital decimation filter that receives the output of the quantizer by an amount that is substantially equal to the predetermined factor.

In accordance with another aspect of the invention, an A/D converter includes a delta-sigma modulator wherein the full-scale analog input voltage is set below a maximum effective feedback reference voltage by a predetermined factor; and, impulse-response coefficients of a digital decimation filter coupled to the output of the delta-sigma modulator are selected to provide full-scale digital output when a full-scale analog input voltage is applied to the analog input node of the delta-sigma modulator.

In accordance with yet another aspect of the invention, a method for selectively applying charge to a charge summing node from either a positive reference voltage or from a negative reference voltage includes charging a first switched capacitor from the positive reference voltage while simultaneously charging a second switched capacitor from the negative reference voltage, and then selectively discharging one of the capacitors to ground while dumping the charge from the other capacitor into the charge summing node.

The aforementioned and other features, characteristics, advantages, and the invention in general, will be better understood from the following detailed description of an illustrative embodiment when taken in conjunction with the accompanying drawings.

DETAILED DESCRIPTION OF A PREFERRED EMBODIMENT

Figure 1:
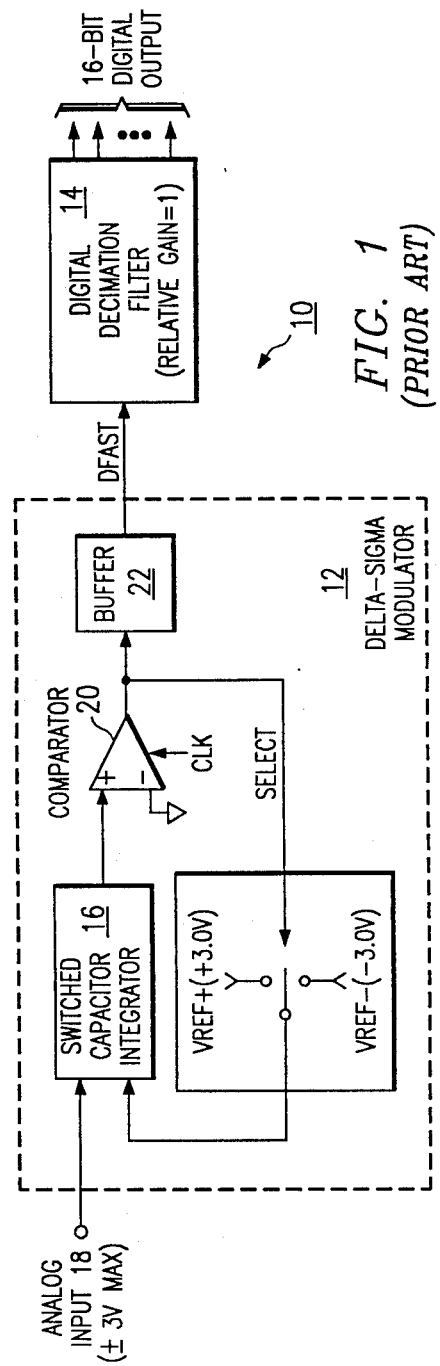
FIG. 1 is a block diagram of an A/D converter of the prior art.
Figure 3:
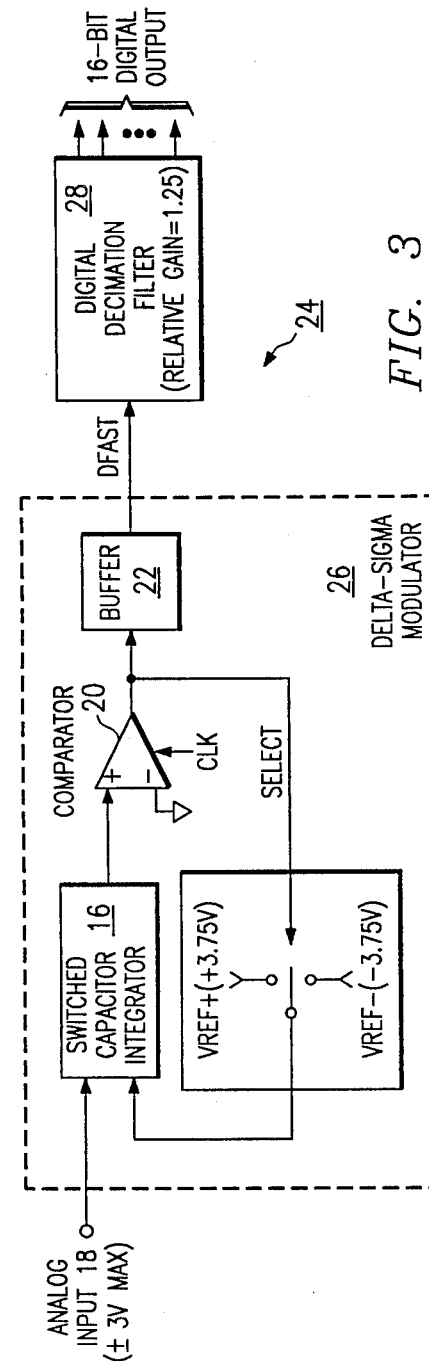
FIG. 3 is a block diagram of an A/D converter in accordance with the method and circuitry of the present invention.

Referring now to FIG. 3, a -16-bit A/D converter 24 of a type which is utilized in conjunction with the method of the present invention is illustrated. Using like numerals for elements in FIG. 3 that are equivalent to elements in FIG. 1, the A/D converter 24 includes a delta-sigma modulator 26 which has an analog input node 18 for receiving the analog input signal. The delta-sigma modulator 26 provides an output signal DFAST to a digital decimation filter 28 which, in turn, provides a 16-bit digital output. As with the prior art A/D converter 10 of FIG. 1, the A/D converter 24 includes a switched capacitor integrator 16, a clocked comparator 20, and a buffer 22. The prior art A/D converter 10 and the A/D converter 24 both have the same specified maximum analog input voltage; for the illustrative embodiment, the maximum analog input voltage is specified to be no greater than plus or minus three volts.

Figure 2:
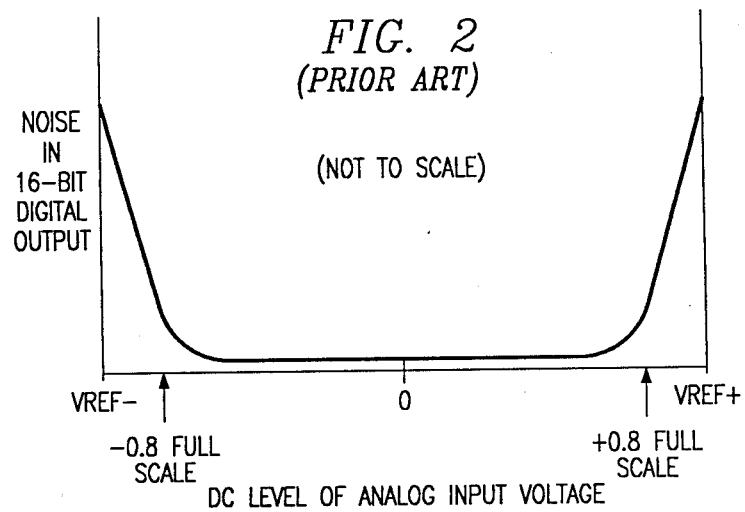
FIG. 2 is a diagram illustrating noise in a 16-bit digital output of a prior art A/D converter as a function of the DC level of the analog input voltage.

In the prior art A/D converter 10, the positive effective feedback voltage reference VREF+ is set to be equal to the specified maximum positive analog input voltage, and the negative effective feedback voltage reference VREF− is set to be equal to the specified maximum negative analog input voltage; but in the A/D converter 24, the effective positive feedback voltage reference VREF+ is set to a value that is a predetermined factor greater than the specified maximum positive analog input voltage, and the effective negative feedback voltage reference VREF− is set by the same predetermined factor to a value that is greater than the specified maximum negative analog input voltage. For the illustrative embodiment, the predetermined factor is 1.25; accordingly, in the delta-sigma modulator 26 of FIG. 3 the effective positive feedback voltage reference VREF+ is set to +3.75 volts, and the effective negative feedback voltage reference VREF− is set to −3.75 volts. Thus, the full-scale analog input voltage is equal to 8/10 of the effective feedback voltage reference. Consequently, the high noise regions at the extremes of the diagram of FIG. 2 are not encountered in the present invention for the normal range of analog input voltages.

The term "effective" is used herein in conjunction with the discussion of values of the feedback voltage reference. If equal-value capacitors are used to sample the analog input signal and the feedback voltage reference, the effective feedback voltage reference is the same as the actual feedback voltage reference. If equal-value capacitors are not used, however, the effective feedback voltage reference is not the same as the actual feedback voltage reference. For example, a higher capacitance may be used to sample the actual feedback reference voltage than is used to sample the analog input signal. Accordingly, as used herein, the phrase "effective feedback voltage reference" means the actual value of the feedback voltage reference multiplied by the ratio of the capacitance used to sample the actual feedback reference voltage to the capacitance used to sample the analog input signal.

If the digital decimation filter 14 of the prior art A/D converter 10 were to be combined with the delta-sigma modulator 26 of the A/D converter 24, the 16-bit digital output would not provide a full-scale digital output should a full-scale analog input voltage be applied to the analog input node 18. In order to provide a full-scale digital output when a full-scale analog input voltage is applied to the analog input node 18, the gain of the digital decimation filter 28 is made greater than that of the digital decimation filter 14 by the same factor by which the effective feedback voltage reference is greater than the specified maximum analog input voltage. Accordingly, for the case where the effective voltage reference of the delta-sigma modulator 26 is set to 3.75 volts and the specified maximum analog input voltage is −3.0 volts (establishing a ratio of 1.25), the digital decimation filter 28 of FIG. 3 is set to have a gain of 1.25 times that which is suitable for the digital decimation filter 14 of FIG. 1.

Figure 4:
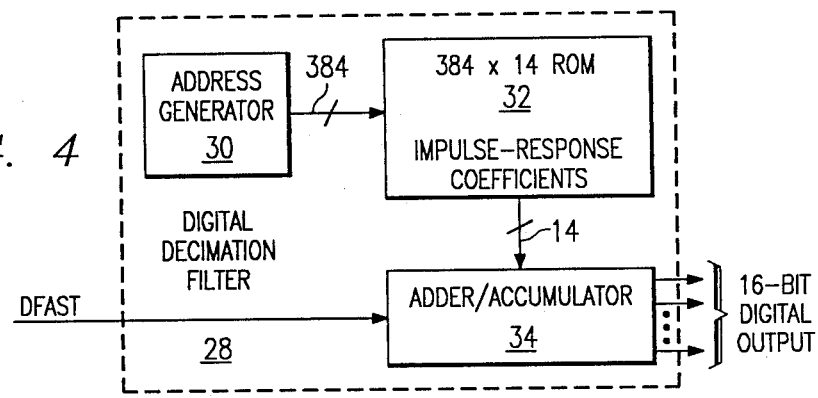
FIG. 4 is a block diagram of the digital decimation filter used in the A/D converter of FIG. 3.

Referring now to FIG. 4, there is illustrated a block diagram of the digital decimation filter 28 which is utilized in the A/D converter 24 of FIG. 3. The architecture and circuitry of the digital decimation filter 28 are identical to that of the digital decimation filter 14 used in the prior art A/D converter 10 of FIG. 1; the only modification for the digital decimation filter 28 is that the magnitudes of the impulse-response coefficients are scaled up.

The digital decimation filter 28 includes an address generator 30 which selects one of 384 14-bit words from a 384×14 ROM 32. Each of these 14-bit words comprises an impulse-response coefficient that is used in the convolution process described below.

An adder/accumulator 34 receives both the impulse-response coefficients and the high-speed signal DFAST. The signal DFAST controls whether an impulse-response coefficient is added to or subtracted from a digital word stored in an accumulator register in the adder/accumulator 34.

Figure 5:
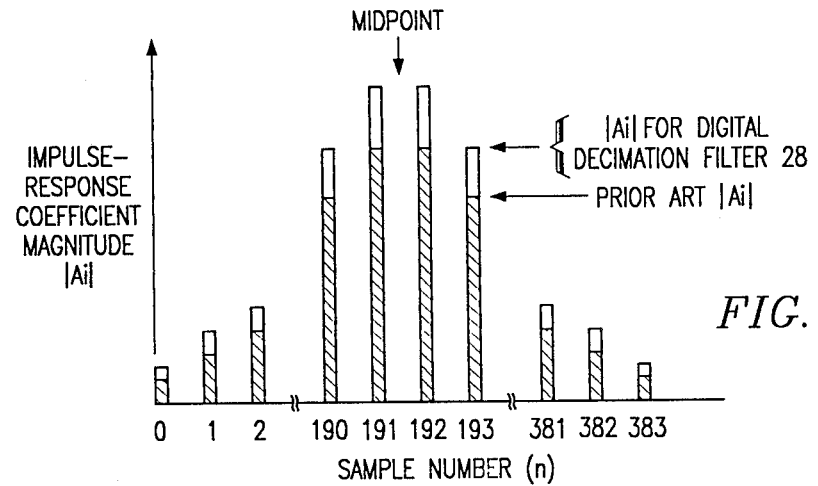
FIG. 5 is a bar graph illustrating the magnitudes of digital impulse-response coefficients utilized in the convolution processes of the digital decimation filters included in the A/D converters of FIGS. 1 and 3.

Referring now to FIG. 5, there is shown a bar graph which illustrates the magnitudes of the digital ROM coefficients which are utilized in the convolution process of the prior art digital decimation filter 14 and the larger magnitudes of those that are used in the convolution process of the digital decimation filter 28. This bar graph is indicative of what is termed a 384th Order decimation filter. The symmetry about the mid point of the graph indicates that the filter will have a linear phase versus frequency characteristic, which is highly desirable for many applications. Additionally, this type of filter is referred to as a finite impulse response filter. For clarity and simplicity of understanding, the manner by which a 384th Order non-pipelined filter operates is next described.

In a non-pipelined architecture, the convolution process commences with the clearing of the accumulator, followed by adding or subtracting the 384th 14-bit impulse-response coefficient, designated in FIG. 5 as $A_{383}$, to or from the accumulator. During the next clock cycle, the 14-bit impulse-response coefficient $A_{382}$ is then likewise added to or subtracted from the accumulator. That process is repeated until all impulse-response coefficients have been added to or subtracted from the accumulator. The final result in the accumulator is a digital number which is indicative of the value of the analog voltage being applied to the input of the A/D converter.

As illustrated in FIG. 5, the magnitude of each of the impulse-response coefficients for the digital decimation filter 28 by comparison to each of those of the prior art digital decimation filter 14 is scaled up by the same ratio that the positive and negative effective feedback voltage references bear to the specified maximum analog input voltages.

Figure 6:
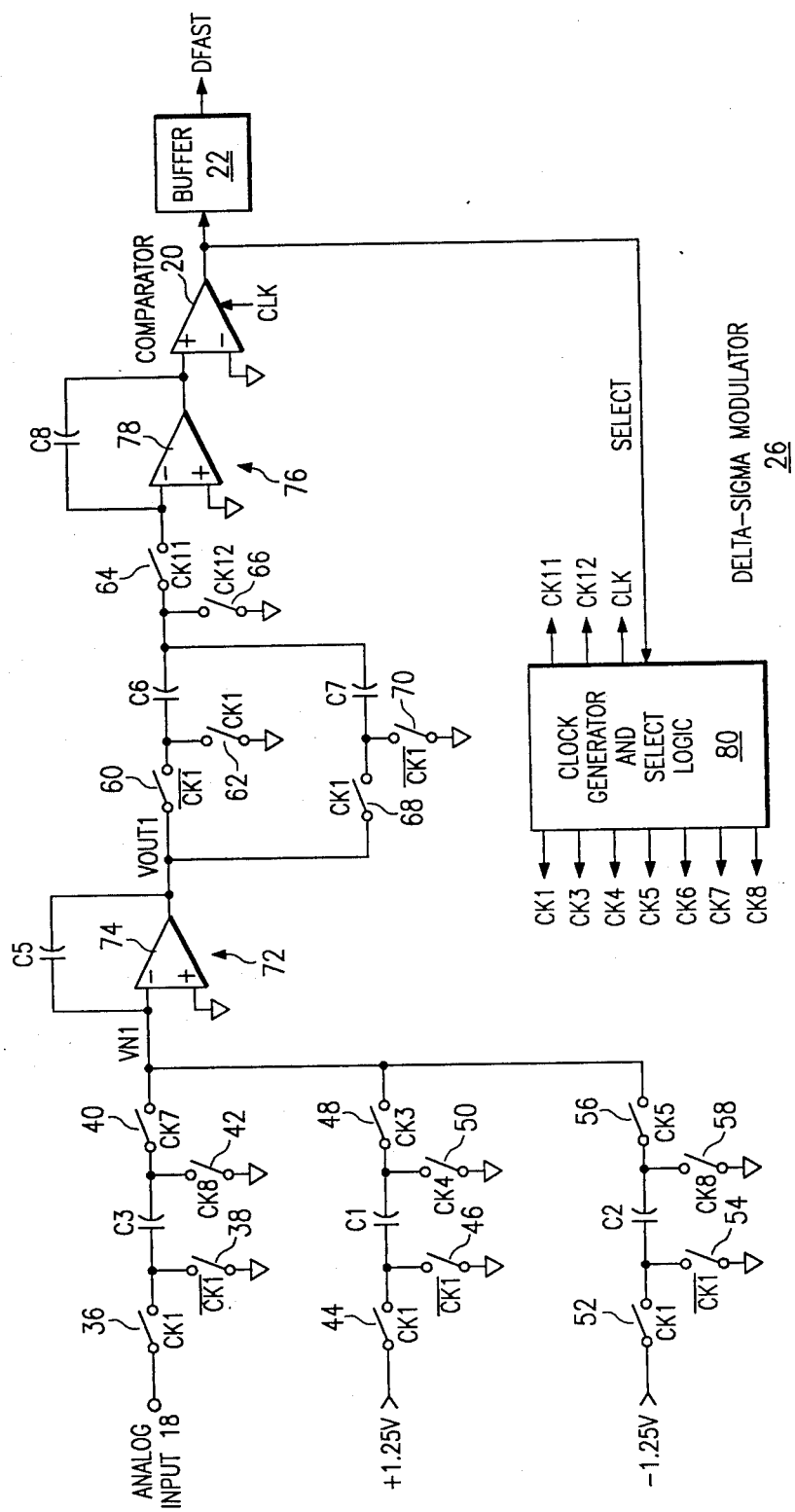
FIG. 6 is a schematic diagram illustrating details of an embodiment of a delta-sigma modulator in accordance with the present invention.

Referring now to FIG. 6, a schematic diagram illustrates details of an embodiment of the delta-sigma modulator 26 as included in the A/D converter 24 of FIG. 3. The delta-sigma modulator 26 includes switched capacitors C3, C1, C2, C6, and C7. One terminal of the switched capacitor C3 is connected to switches 36 and 38; the other terminal of the switched capacitor C3 is connected to switches 40 and 42. One terminal of the switched capacitor C1 is connected to switches 44 and 46; the other terminal of the switched capacitor C1 is connected to switches 48 and 50. One terminal of the switched capacitor C2 is connected to switches 52 and 54; the other terminal of the switched capacitor C2 is connected to switches 56 and 58. One terminal of the switched capacitor C6 is connected to switches 60 and 62; the other terminal of the switched capacitor C6 is connected to switches 64 and 66. One terminal of the switched capacitor C7 is connected to switches 68 and 70; the other terminal of the switched capacitor C7 is connected to the switches 64 and 66.

The delta-sigma modulator 26 further includes a first integrator 72 comprising an operational amplifier 74 and a charge accumulating capacitor C5. The inverting input of the operational amplifier 74 comprises a charge summing node designated as VN1. The output of the first integrator 72 is designated as VOUT1.

A second integrator 76 comprises an operational amplifier 78 and a charge accumulating capacitor C8. The output of the second integrator 76 is coupled to the noninverting input of a clocked comparator 20. The output of the clocked comparator 20 is coupled through a buffer 22 to provide the signal DFAST. The output of the clocked comparator 20 is designated as the signal SELECT and is provided as an input to clock generator and select logic 80.

The clock generator and select logic 80 provides control signals CK1, CK3, CK4, CK5, CK6, CK7, CK8, CK11, CK12, and CLK for controlling the operation of the switched capacitors and for strobing the clocked comparator 20 at appropriate times.

The switched capacitor C3 samples the analog input signal on the analog input node 18 when the switches 36 and 42 are closed, and dumps the charge thereon to the charge summing node VN1 after the switches 36 and 42 are opened and when the switches 38 and 40 are closed. The switched capacitor C3 is made to have a capacitance of 5 pF.

The switched capacitor C1 is made to have a capacitance of 15 pF and is charged to a positive voltage reference of +1.25 volts when the switches 44 and 50 are closed. The charge on the switched capacitor C1 is dumped onto the charge summing node VN1 only if the switches 44 and 50 are opened and the switches 46 and 48 are subsequently closed. Alternatively, for a clock cycle wherein it is not desired to dump charge received from the positive reference voltage, the charge on the switched capacitor C1 is discharged to ground by the closure of switches 46 and 50 rather than 46 and 48.

Because the capacitance of the switched capacitor C1 is three times larger than that of the switched capacitor C3, dumping the charge from the switched capacitor C1 onto the summing node VN1 is equivalent to dumping the charge from a 5 pF capacitor which has been charged to 3.75 volts. Accordingly, although the actual positive feedback reference voltage is +1.25 volts, the positive effective feedback reference voltage is +3.75 volts.

The switched capacitor C2 is likewise a −15 pF capacitor, but it is charged to a negative reference voltage of −1.25 volts. In the same manner as for the switched capacitor C1, the switched capacitor C2 can selectively be caused to dump its charge on the charge summing node VN1 (by closure of the switches 54 and 56 after the capacitor C2 has been charged) or, alternatively, the switched capacitor C2 is discharged to ground during a clock cycle by closure of the switches 54 and 58.

As a result of the scaling of the switched capacitors C1 and C2 with respect to the switched capacitor C3, the positive effective feedback reference voltage is +3.75 volts and the negative effective feedback reference voltage is −3.75 volts. An alternative arrangement for the feedback path would be the use of a single switched capacitor in conjunction with control circuitry for causing the switched capacitor to be charged either to the positive feedback reference voltage or to the negative feedback reference voltage. The use of two switched capacitors in the feedback loop as illustrated in FIG. 6, however, is advantageous for the reason that a more constant current load is imposed on each of the reference voltages; consequently, each of the reference voltages can more readily be maintained at a stable voltage.

The switched capacitors C3, C1, C2, with their associated switches 36–58, and with the first integrator 72, comprise a first switched capacitor accumulator. The switched capacitors C6 and C7, with their associated switches 60–70, and with the second integrator 76, comprise a second switched capacitor accumulator. The charge accumulating capacitor C5 has a typical capacitance of 20 pF; the charge accumulating capacitor C8 has a typical capacitance of 15 pF; the switched capacitor C6 has a typical capacitance of 5 pF, and the switched capacitor C7 has a typical capacitance of 2.5 pF.

Figure 7:
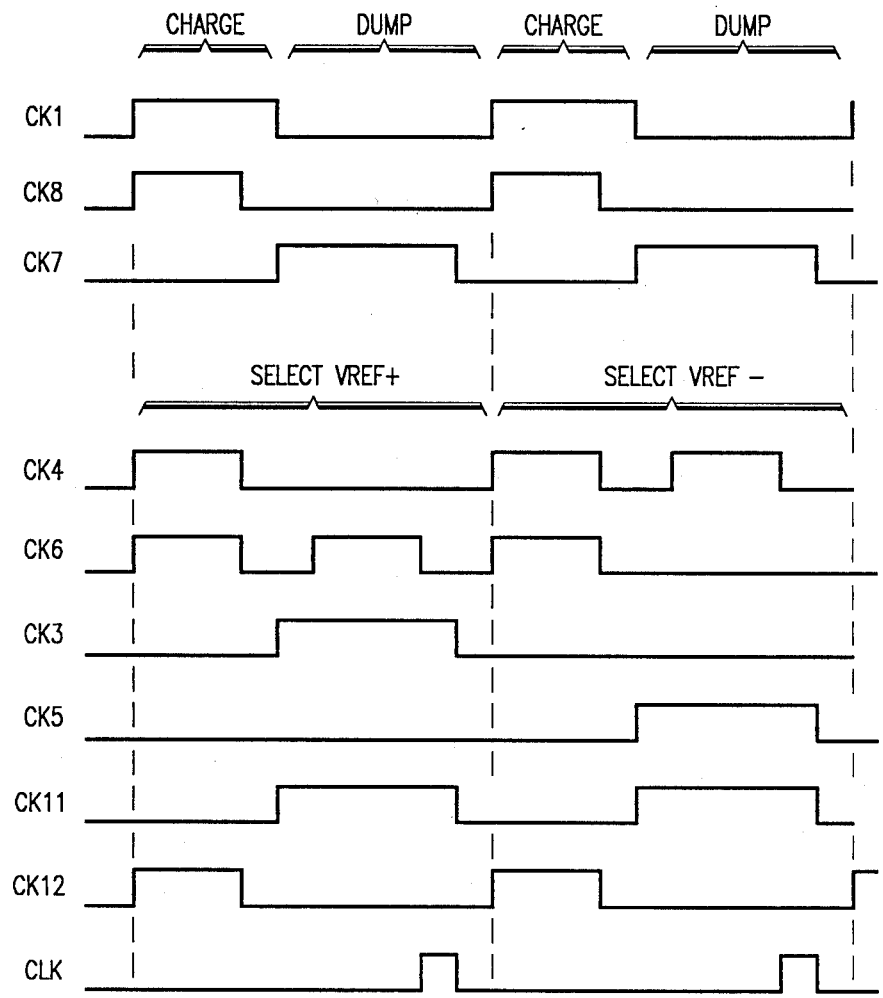
FIG. 7 is a timing diagram illustrating timing relationships of the control signals of FIG. 6 in accordance with the present invention.

Referring now to FIG. 7, there is illustrated a timing diagram showing the relationship of the control signals which are outputted from the clock generator and select logic 80. As illustrated, the control signals CK1, CK8, CK7, CK11, CK12, and CLK are continuously repetitive signals that are independent of the signal SELECT. The control signal CK4, CK6, CK3, and CK5 depend upon whether the signal SELECT commands the positive effective feedback reference voltage or the negative effective feedback reference voltage to be selected; that is, whether charge on the switched capacitor C1 or charge on the switched capacitor C2 is to be dumped to the charge summing node VN1.

A preferred embodiment of the present invention has been described. It should be apparent to persons of ordinary skill in the art that changes may be made in the method and circuitry described without departing from the spirit and scope of the invention.

What is claimed is:

1. A method of, gain scaling an A/D converter having an oversampling front end quantizer, the oversampling front end quantizer being of the type wherein a sample of the analog input voltage and an effective feedback reference voltage are integrated, the A/D converter also having a digital decimation filter coupled to the output of the oversampling front end quantizer, said method comprising:
   a. setting said effective feedback reference voltage to a value that is a predetermined factor greater than a specified maximum analog input voltage; and,
   b. using a gain factor for said digital decimation filter that is substantially equal to said predetermined factor.

2. A method of gain scaling an A/D converter, said A/D converter having an oversampling front end quantizer of the type wherein the charge on a first switched capacitor resulting from sampling the analog input voltage is accumulated on an integrator capacitor together with the charge on a second switched capacitor resulting from sampling a reference voltage, said method comprising:
   a. setting said reference voltage to a value which is greater than the specified maximum analog input voltage divided by the ratio of the capacitance of said second switched capacitor to the capacitance of said first switched capacitor; and,
   b. using a gain factor for said digital decimation filter substantially equal to said ratio of capacitances times the value of said reference voltage, divided by said specified maximum analog input voltage.

3. A method of gain scaling an A/D converter of the type having a front end comprising a delta-sigma modulator, said delta-sigma modulator utilizing therewith an effective feedback reference voltage, the output of said delta-sigma converter being coupled to the input of a digital decimation filter, said digital decimation filter being of the type that utilizes predetermined impulse-response coefficients in a convolution process for providing digital output codes representative of the analog input voltage, comprising: using impulse-response coefficients for the convolution process that result in the digital decimation filter providing a multi-bit digital code which represents the maximum digital output when the analog input voltage reaches a predetermined fraction of the effective feedback reference voltage, said predetermined fraction being a value of less than one.

4. An A/D converter, comprising:
   a. a delta-sigma modulator having an analog input voltage node, the specified full-scale analog input voltage for said delta-sigma modulator being defined to be less than a maximum effective feed back reference voltage by a predetermined factor; and,
   b. a digital decimation filter coupled to the output of said delta-sigma modulator and wherein said digital decimation filter impulse-response coefficients are selected to provide full-scale digital output when a full-scale analog input voltage is applied to the analog in put voltage node of said delta-sigma modulator.

5. An A/D converter front end quantizer having an analog input voltage node and having specified maximum values for positive and negative analog input voltages, comprising:
   a. a first switched capacitor accumulator comprising:
      i. a first switched capacitor for sampling the analog input voltage, said first switched capacitor being selectively connectable to the analog input voltage node or to a charge summing node of said first stage;
      ii. a second switched capacitor for sampling a positive voltage reference, said second switched capacitor being selectively connectable to a positive voltage reference or to said summing node, the magnitude of said positive voltage reference being greater than the magnitude of the specified maximum positive analog input voltage divided by the ratio of capacitance of said second switched capacitor to said first switched capacitor;
      iii. a third switched capacitor for sampling a negative voltage reference, said third switched capacitor being selectively connectable to a negative voltage reference or o said charge summing node, the magnitude of said negative voltage reference being greater than the magnitude of the specified maximum negative analog input voltage divided by the ratio of capacitance of said third switched capacitor to said first switched capacitor;
      iv. In integrator having an input coupled to said charge summing node, the output of said integrator providing an output of said first stage;
   b. a second switched capacitor accumulator having an output node and having an input coupled to the output of said first switched capacitor accumulator;

c. a clocked comparator having an output node and having an input coupled to the output node of said second switched capacitor accumulator;

d. circuit means coupled to the output node of said clocked comparator and responsive to the output signal thereon for selectively generating control signals for controlling the switching of said first, second, and third switched capacitors.

6. A method for selectively applying charge to a charge summing node, said charge being received from either a positive reference voltage or from a negative reference voltage, said method comprising:

a. coupling a first switched capacitor between the positive reference voltage and ground while coupling a second switched capacitor between the negative reference voltage and ground to thereby charge said first switched capacitor from the positive reference voltage while simultaneously charging said second switched capacitor from the negative reference voltage; then, b. uncoupling said first switched capacitor from said positive reference voltage and simultaneously uncoupling said second switched capacitor from said negative reference voltage; and then, c. coupling said first switched capacitor between ground and said charge summing node and discharging said second switched capacitor to ground if it is desired to apply charge to the charge summing node from the positive reference voltage, or, alternatively, coupling said second switched capacitor between ground and said charge summing node and discharging said first switched capacitor to ground if it is desired to apply charge to the charge summing node from the negative reference voltage.

* * * * *